United States Patent
Mayes et al.

(10) Patent No.: US 7,556,725 B2
(45) Date of Patent: Jul. 7, 2009

(54) SEALING RING ASSEMBLY AND MOUNTING METHOD

(75) Inventors: Ian Christopher Mayes, Bedfordshire (GB); James Gough, Somerset (GB); Ian Gilbert, Hertfordshire (GB); Harvey Podgorney, Bedfordshire (GB)

(73) Assignee: Nanometrics Incorporated, Milpitas, CA (US)

( * ) Notice: Subject to any disclaimer, the term of this patent is extended or adjusted under 35 U.S.C. 154(b) by 816 days.

(21) Appl. No.: 10/905,717

(22) Filed: Jan. 18, 2005

(65) Prior Publication Data

US 2005/0244710 A1    Nov. 3, 2005

Related U.S. Application Data

(63) Continuation of application No. PCT/GB03/02819, filed on Jun. 30, 2003.

(51) Int. Cl.
*G01N 27/403* (2006.01)
*F16L 17/00* (2006.01)

(52) U.S. Cl. .................... 204/409; 205/790.5; 204/400; 277/616

(58) Field of Classification Search ......... 204/400–419, 204/433–435; 277/408, 616, 625, 637; 205/790.5
See application file for complete search history.

(56) References Cited

U.S. PATENT DOCUMENTS 4,028,207 A    6/1977 Faktor et al.
4,168,212 A    9/1979 Faktor et al.

FOREIGN PATENT DOCUMENTS

| DE | 31 03 611 A1 | 9/1982 |
|---|---|---|
| DE | 197 40 025 A1 | 3/1999 |
| DE | 101 07 689 A1 | 1/2003 |
| WO | WO-2004/008523 A2 | 1/2004 |
| WO | WO-2004/008523 A3 | 1/2004 |

OTHER PUBLICATIONS

GB Application No. 0216605.6 filed on Jul. 17, 2002 by AOTI Operating Company, Inc., twenty-seven pages.
International Search Report mailed on Apr. 6, 2004 for PCT Application No. PCT/GB2003/002819 filed on Jun. 30, 2003, four pages.
Mayes, I.C. (1992). "Electrochemical C-V Profiling of Silicon," *ECS Symposium on Diagnostic Techniques for Semiconductor Materials and Devices* 92(2):249-260.

Primary Examiner—Alex Noguerola
(74) *Attorney, Agent, or Firm*—Silicon Valley Patent Group, LLP

(57) ABSTRACT

A sealing ring assembly and an improved method for mounting a sealing ring into an electrochemical cell used for Electrochemical Capacitance Voltage (ECV) profiling measurements. The ring is located in a holder having at least one secondary bore providing fluid communication between a forward face of the holder and the central bore of the ring, directed parallel to but tangentially offset relative to the inner wall of the central bore so as to impart a degree of rotational flow to electrolyte entering the sealing ring through the or each secondary bore which effectively removes gas bubbles and refreshes the electrolyte. The holder facilitates ring removal with a much reduced risk of damage to the delicate sealing surface.

14 Claims, 3 Drawing Sheets

SEALING RING ASSEMBLY AND MOUNTING METHOD

CROSS REFERENCE TO RELATED APPLICATIONS

This Application is a continuation of International Application No. PCT/GB2003/002819 filed on 30 Jun. 2003. Application PCT/GB2003/002819 claims priority from Application 2016605.6 filed on 17 Jul. 2002 in the United Kingdom. The entirety of each of these applications is incorporated herein by reference.

BACKGROUND OF THE INVENTION

The invention relates to a sealing ring assembly and an improved method for mounting a sealing ring into an electrochemical cell so as to improve the repeatability of electrochemical capacitance voltage (ECV) measurements.

Semiconductor devices are made by sandwiching layers of material of different electrical and/or optical properties together. The layers are formed by epitaxial growth on or ion implantation or diffusion into a substrate wafer. Correct device operation necessitates close control of layer properties including carrier concentration and thickness. U.S. Pat. Nos. 4,028,207 & 4,168,212 describe the ECV profiling method, which is used for determining the carrier concentration as a function of depth into the layer and is therefore ideally suited to measuring these parameters.

ECV profiling makes use of the diode structure formed when a conducting liquid (electrolyte) is placed in contact with a semiconductor. The capacitance of the junction, in the reverse bias region, is determined by the magnitude of the applied bias and the carrier concentration vs. depth profile. By measuring this capacitance as a function of bias the carrier concentration depth profile can be determined. In this mode of operation the ECV profiler is similar to tools, which use metallisation or mercury in place of an electrolyte to form a diode structure. However, such tools are usually restricted to shallow depth profiles due to reverse bias breakdown of the semiconductor-metal junction. By using an electrolyte this limitation is overcome. The electrolyte is used to electrochemically etch into the sample, increasing the depth profiled without increasing the measurement bias. This makes ECV profiling a very powerful method for characterizing multilayer structures.

ECV profiling is carried out using electrochemical cells of designs which will be familiar to the skilled person. The cell provides a conducting electrolyte reservoir for the profiling process and includes suitable reference and counter electrodes. Electrolyte is caused to contact with a semiconductor sample under test, which becomes the working electrode of the cell. Usually a chemically resistant plastic ring, referred to as a sealing ring, defines the area of contact between the electrolyte and the semiconductor sample. Any damage to the sealing edge of the ring has a big effect on the measurements. In extreme cases the seal will leak and no measurement is possible. Usually the sealing ring is pressed into a counter bore in the electrochemical cell body. This action involves applying pressure close to the seal and there is always the possibility of contacting the seal and damaging it.

Accurate measurements depend on knowing the precise area of contact between the test sample and the electrolyte and ensuring that it remains stable throughout the measurement process. Some seepage under the lip of the ring is inevitable and this will give rise to errors in the analysis, but the design of the ring is such that this is minimized and stable for any given electrolyte.

The sealing ring is made by injection moulding and its small size makes it difficult to handle and avoid accidental damage to the sealing edge. Ideally the sealing edge should make a knife edge contact with the sample although some compliance is essential to allow for slight misalignment or non planer samples. However to avoid excessive deformation, the edge has to be sufficiently rigid and this is achieved by employing a cone like structure with the material progressively getting thinner towards the sealing edge. The bore of the cone is also tapered to ensure the surface of the sample can be uniformly illuminated through the electrolyte.

Gas bubbles can affect the measurement during profiling. Gas bubbles arise due to trapped air when the electrochemical cell is initially filled, or during electrolyte circulation or are a result of the electrochemical reactions used to etch the sample. Gas bubbles lead to non-planer etching which changes the measurement area and can seriously affect measurement quality when multi-layer structures or structures with changing carrier concentration are being profiled. The bubbles can be removed by circulating the electrolyte in the cell, but the shape of the sealing ring makes this difficult, giving rise to dead spots where there is little or no flow allowing bubbles to accumulate.

In many prior art systems the semiconductor sample is mounted vertically. This helps prevent reaction products dropping back onto the surface of the sample and makes it easier to drain the electrochemical cell at the end of the measurement. However in this orientation gas bubbles are more prone to collect in the ring and affect the ECV profiling measurement.

Electrochemically etching occurs when the sample is the anode (biased positively with respect to a counter electrode). For p-type material this is the forward bias condition and electrochemical etching readily takes place. For n-type material this is the reverse bias condition and electrochemical etching only occurs when the sample is illuminated with light of energy above the band-gap of the material. The requirement to illuminate the sample surface for n-type materials means that any form of pumping system used to circulate the electrolyte in the ring, must not obstruct the illumination system.

Several schemes for removing bubbles and reaction products have been described. German Pat. Nos. DE3103611 discloses a device, which uses ultra-sound to perform this task. A modified sealing ring design is shown in "I. Mayes—Electrochemical C-V Profiling of Silicon", ECS Symposium on Diagnostic Techniques for Semiconductor Materials and Devices, 1992, Vol 92-2, p249-260". The sealing ring uses three tangential jets spaced 120 degrees apart to generate swirl in the electrolyte and sweep bubbles and other reaction products away from the surface of the sample, which in this case is mounted horizontally.

However this design is not suitable for vertically mounted samples. Gas bubbles tend to collect behind the jets and are not removed unless the electrolyte flow rate is very high. In practice high flow rates are difficult to achieve. Peristaltic and diaphragm pumps tend to produce undesirable pressure fluctuations. A magnetically coupled centrifugal pump meets the requirement for the pump to be chemically inert, non-shedding and be capable of being easily drained. Such pumps are prone to cavitation at high speeds and their use in this application is therefore restricted to reduced flow rates.

BRIEF SUMMARY OF THE INVENTION

Embodiments of this invention provide a sealing ring assembly and an improved method for mounting a sealing ring into an electrochemical cell which mitigates some or all of the above disadvantages, and in particular which is more effective in removing bubbles and reaction products and/or is less vulnerable to damage to the sealing edge.

Exemplary embodiments of the invention provide a sealing ring and sealing ring assembly incorporating means of circulating the electrolyte so that any trapped air or gas generated during etching is swept out of the system and does not interfere with the ECV profiling measurement.

Some aspects of the invention provide a sealing ring and sealing ring assembly which is removable from the electrochemical cell, for inspection and cleaning, with reduced risk of damage to its delicate sealing edge, thus improving the reproducibility of measurements made by ECV profiling.

Thus, in accordance with the invention in a first aspect, a sealing ring assembly for fitment to an electrochemical cell used for ECV profiling of a semiconductor sample to define a contact area between electrolyte within the cell and the semiconductor sample comprises a sealing ring having a generally axial central bore, and a sealing ring holder adapted to engage upon an electrochemical cell and so retain the sealing ring in position, wherein the holder is provided with at least one secondary bore providing fluid communication between a forward face of the holder and the central bore, the or each secondary bore being directed parallel to but tangentially offset relative to the inner wall of the central bore so as to impart a degree of rotational flow to electrolyte entering the sealing ring through the or each secondary bore.

In use, the sealing ring is fitted to an electrochemical cell. The secondary bore(s) serve as nozzle(s) through which the electrochemical cell is filled with electrolyte. The nozzles are directed parallel to but offset tangentially relative to an axial direction of the ring, so as to impart a degree of rotational flow to the electrolyte. As a result air trapped in the sealing ring's bore is flushed out. The primary bore serves in conjunction with a suitably configured cell, and in particular a vertical cell, to provide a means of allowing gas bubbles to rise and readily escape from the surface of the semiconductor sample.

Select embodiments of the invention have two advantages over existing methods. They make the ring easier to change with a much reduced risk of damage to the delicate sealing surface. These embodiments also incorporate an electrolyte circulation mechanism which effectively removes gas bubbles and refreshes the electrolyte.

It is a significant advantage of embodiments of the present invention that sealing rings may be used of generally conventional design. The invention lies in the use of the holder which allows for the introduction of one or more secondary bores designed in use to serve as directional nozzles to produce the desired rotational flow. Since the desired rotational flow is produced as an inherent feature of the sealing ring assembly, additional pumping mechanisms designed to produce this need not be incorporated into the cell.

Moreover, prior art sealing rings have generally been adapted for press fit engagement into a receiving aperture. This does not assist ready removal, as the delicate sealing edges can become damaged. The present invention may also provide for easy removal of the sealing ring from the electrochemical cell for replacement, inspection and cleaning, and in some instances also to allow interchange with rings having different secondary bore designs to generate alternative flow patterns. The sealing ring holder can reduce risk of damage to the delicate sealing edge.

Sealing ring assemblies in accordance with embodiments of the invention can be used in conjunction with many conventional cell designs without needing major design modifications, and in particular are suited to vertical cell designs.

The sealing ring holder has cell engagement means to engage with an electrochemical cell suited for ECV profiling, and means to receive a sealing ring in so as to position the same in correct location relative to the cell when the cell engagement means are engaged thereon.

At least one and preferably both of the cell engagement means and receive sealing ring receiving means are adapted for ready removal, to allow the ring to be removed from the cell. The sealing ring receiving means are adapted to allow ready removal of the ring without damage to the sealing edge, for example providing for slideable engagement of the sealing ring within a suitable housing. Preferably the sealing ring is held in the holder by overfolds at the edges of the recess in which the ring sits.

The cell engagement means may facilitate engagement of the assembly of sealing ring and holder via sliding, twist-slide, screw or interference fit or combination thereof.

In accordance a preferred embodiment the holder has a part which can be gripped and is designed such that the holder can be placed in and removed from the electrochemical cell without damaging the seal.

Sealing rings of generally conventional shapes may be readily adapted by means of provision of a holder incorporating secondary nozzle(s) in the holder to constitute sealing ring assemblies in accordance with the invention. Thus, suitable structures will readily suggest themselves. In particular, sealing rings may have a cylindrical, conical or frustoconical shape and be provided with a central axial bore, which may be tapered or of constant diameter.

Most preferably, the body of the sealing ring is frustoconical, with the inner bore of the ring is tapered towards the sealing edge with the widest part being away from the sealing edge on the back face of the ring. In this arrangement, the one or more nozzles are directed parallel to the inner cone of the ring and tangential to its perimeter, such that the liquid in the cone is forced to rotate about the cone's major axis. The resulting flow removes reaction products, replenishing the electrolyte and dislodging gas bubbles from the surface of the sample and the inner wall of the ring.

The holder is provided with a sealing ring receiving cavity suitably sized and shaped to receive the sealing ring in snug engagement, and specifically with a generally fluid tight contact between the common faces lying adjacent to maintain a leak proof fluid path through secondary and primary bores. In particular, the holder may have a suitably sized and shaped sealing ring receiving cavity and/or be fabricated from suitable material and/or include suitable urging means to urge the sealing ring into such generally fluid tight contact.

The secondary bore(s) making up the nozzles which impart fluid rotation may be tapered or of constant diameter. Preferably, the secondary bore(s) are of constant diameter.

Preferably, a plurality of secondary bores are provided, disposed to lie in suitable array around the sealing ring assembly. For example a plurality of bores may be disposed so that the nozzles they present at the surface of the holder form at least one circular or arcuate array, the nozzles preferably being evenly spaced therearound. Additional nozzles may be used to increase flow rate or alter the flow pattern.

In a preferred embodiment the nozzles are positioned in an arcuate array extending across no more than half a circle. This can make it easier to avoid interference between the flow they generate and the gas bubble clearance route. In particular, for use in a cell adapted for vertical operation, the nozzles are positioned in an arcuate array to extend in use across the lower half of the sealing ring to avoid them interfering with gas bubble clearance or acting as bubble traps.

The ring and holder may be fabricated from suitable known materials, such as plastics, natural or synthetic rubbers and the like. The material requires chemical resistance to resist the electrolyte, either inherent to the material or in the form of a suitable coating.

The ring is fixed into the holder, which both locates the ring and also contains an aperture or apertures comprising the nozzles for directing the electrolyte flow and facilitating fluid communication therethrough. In a preferred embodiment the ring holder also has a cavity in its rear face to allow gas bubbles to rise and be removed from the inner bore of the ring.

In a simple embodiment of the invention it is assumed that the edge of the sealing ring (sealing surface) and the sample are sufficiently parallel so that a leak will not occur. Usually this is so, but it is prudent to allow for some self alignment of this assembly to offset alignment errors in the machine and possible problems with the sample.

The sealing pressure is very small, so that self alignment of the whole electrochemical cell or wafer chuck, holding the sample, is not practical. Very weak springs would be involved and are not appropriate for these larger and heavier assemblies. It makes more sense to incorporate an alignment mechanism into the sealing ring assembly described above.

Accordingly, in a preferred embodiment the sealing ring is structurally adapted to facilitate a degree of self alignment in use. In particular this is achieved in that the sealing ring is a composite structure giving a degree of compliance at the sealing surfaces, for example a sandwich structure comprising a relatively rigid primary sealing ring (generally as above described) additionally sandwiched on either side by relatively compliant chemically resistant secondary rings. The secondary rings may for example be fabricated from softer silicone or the like.

In use the secondary rings are placed above and below the harder (much less compliant) sealing ring and this sandwich is then retained in the original plastic holder. When placed into the holder the secondary rings are slightly compressed by the action of folding over the edges of the recess in the holder. This prevents leakage. These soft rings are thus able to give a degree of effective self-aligning to the overall composite ring sandwich by accommodating small amounts of non parallism between the sealing ring and the sample. The sealing ring is effectively floating in the holder, not in hard contact with any part. If a non-parallel sample initially contacts one side of the sealing ring the force on this side will cause the ring to move in the holder until it is more parallel.

In a further aspect of the invention an electrochemical cell used for ECV profiling of a semiconductor sample comprises a sealing ring or a sealing ring assembly as above described incorporated thereupon.

In a further aspect of the invention, a method for improving the circulation of electrolyte in an electrochemical cell used for ECV profiling of a semiconductor sample comprising:

locating a sealing ring assembly upon the cell to define a contact area between electrolyte within the cell and the semiconductor sample, wherein the assembly comprises a sealing ring provided with a generally axial central bore and a sealing ring holder adapted to engage upon an electrochemical cell and so retain the sealing ring in position, the holder being provided with at least one secondary bore forming a nozzle in the holder providing fluid communication between a forward face of the holder and the central bore of the ring, and being directed parallel to but tangentially offset relative to the inner wall of the central bore;

associating a semiconductor sample with the cell in suitable position as to lie in electrical contact with the electrolyte in use;

using the nozzle(s) to fill the electrochemical cell with electrolyte, so that electrolyte is forced to rotate about a central axis of the ring and air trapped in the sealing bore is flushed out.

In a preferred embodiment, the sealing ring is first associated with the sealing ring holder, for example being inserted in a retaining cavity therein, and the holder then mounted upon the cell to retain the ring in appropriate orientation.

In particular, the cell is adapted for vertical operation, and the sealing ring holder comprises a plurality of nozzles positioned in an arcuate array extending across no more than half a circle across the lower half of the sealing ring.

Preferably there is also provided, integrally or additionally to the ring and/or holder, a means of allowing gas bubbles to rise and readily escape from the surface of the semiconductor sample and the inner bore of the sealing ring. In particular, an obround slot with its major axis vertical is used to increase the electrolyte flow rate towards the top of the ring to allow gas bubbles to escape more readily.

In accordance with the method a suitable holder is used in conjunction with a plastic sealing ring which may be of conventional design. The inner bore of the ring is preferably tapered towards the sealing edge with the widest part being away from the sealing edge on the back face of the ring.

DETAILED DESCRIPTION OF THE INVENTION

Figure 1:
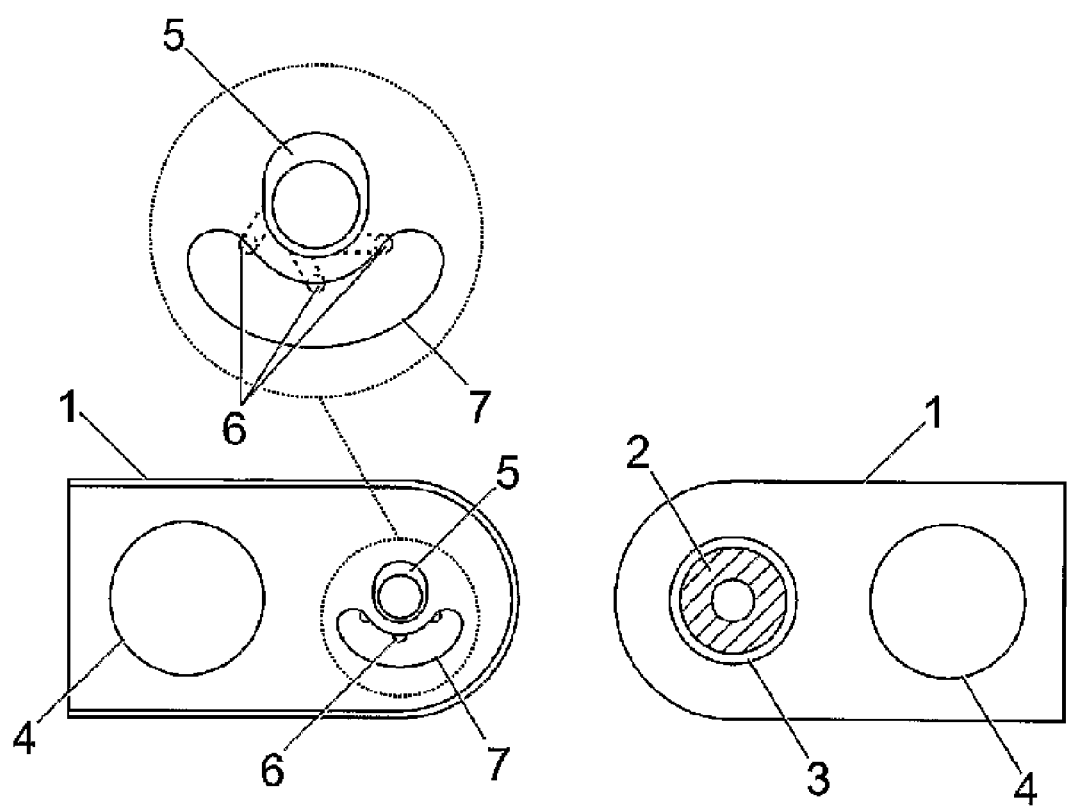
FIG. 1 shows a diagrammatic illustration of a ring holder in which a sealing ring is mounted.

Referring to the figures and firstly to FIG. 1 there is shown a diagrammatic illustration of an apparatus in accordance with the invention.

The apparatus essentially comprises a ring holder [1] in which is mounted a sealing ring [2]. The front of the holder has a recess [3] to locate the ring and hold it in place. The back of the holder contains the electrolyte delivery system [6][7] and an exit port for the electrolyte and bubbles [5]. A finger hole [4] to one side of the holder provides a simple means of removal from the electrochemical cell without damage to the sealing ring.

Figure 2:
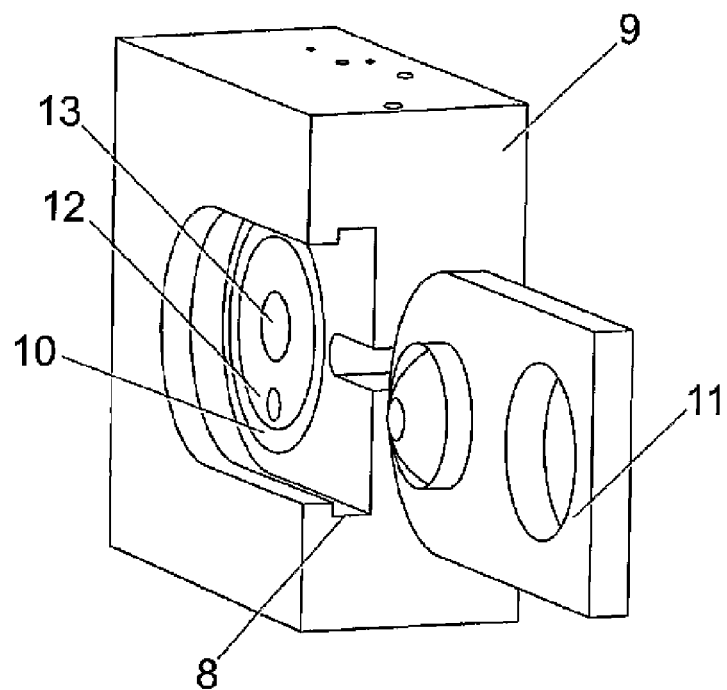
FIG. 2 shows a diagrammatic illustration of an electrochemical cell body having a slot in which the ring holder is located.
Figure 2:
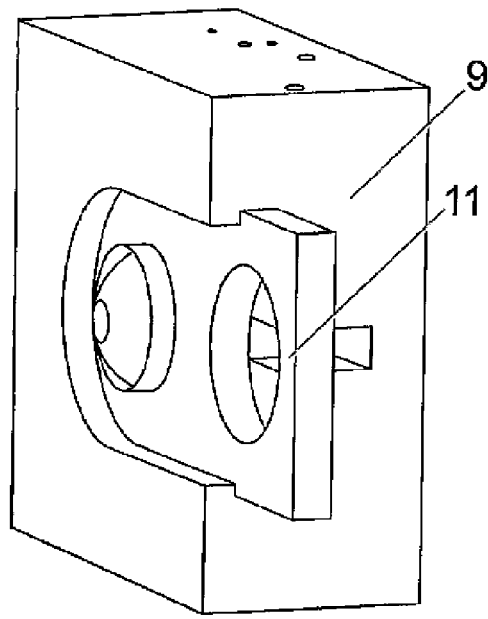

In the embodiment shown in FIG. 1, the ring holder is made from a chemically inert plastic and the ring is crimped into the holder by folding over the sides of the recess. The holder is designed to locate in a slot [8] in the electrochemical cell body [9], see FIG. 2. An 'O' ring [10] in the cell body ensures a liquid tight seal with the rear face of the sealing ring holder [11]. The outer edge of the rear face of the holder is radiused to avoid damage to avoid damage to the 'O' ring when the holder is slid into or removed from the electrochemical cell body. Electrolyte enters the ring holder through an aperture [12] in the electrochemical cell body and leaves the ring holder, returning to the cell by a second aperture [13].

In the embodiment shown in FIG. 1 the sealing ring is represented for simplicity as a unitary construction. In practice a sandwich construction with a realtively rigid cebtral ring between more compliant outer rings will be preferred. As this is received in the holder the outer rings are slightly compressed by the action of folding over the edges of the recess in the holder. This prevents leakage and ensures in particular that if a non-parallel sample initially contacts one side of the sealing ring the force on this side will cause the composite ring to move within the holder until it is more parallel.

In the embodiment shown in FIG. 1, three nozzles [6] are positioned towards the bottom of the sealing ring [2] in a recess [7] that distributes the electrolyte to the nozzles. They are angled so that they are parallel and tangential to the inner wall of the ring so as to impart a slightly rotational flow to the electrolyte entering the sealing ring through them. Because the holder by necessity is made of thin material the diameter of the nozzles is small to preserve the correct angle. However it is within the scope of the invention to use more or fewer nozzles to control either the flow rate, flow pattern or both.

In a preferred embodiment of the invention the exit port [5] is obrounded with its major axis vertical to allow gas bubbles to rise and readily escape. The obround is positioned so as not to obstruct uniform illumination of the sample. The obround is not centred on the seal, but is offset so that there is space for gas bubbles to rise and leave the ring, without being trapped against the holder.

Figure 3:
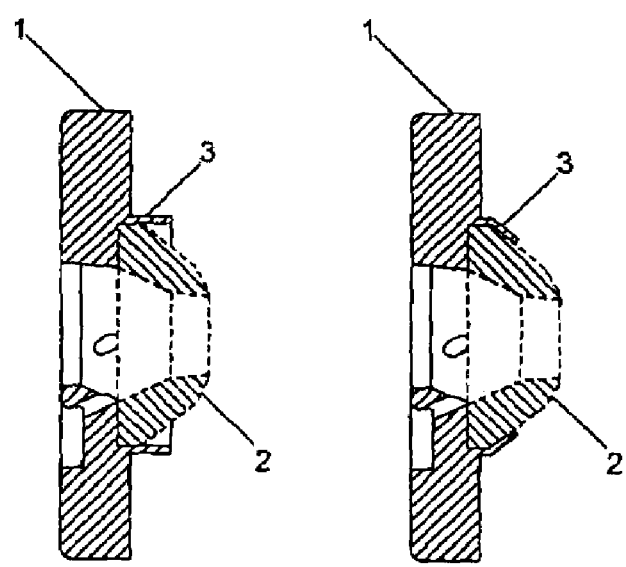
FIG. 3 shows a diagrammatic illustration of a sealing ring held in a recess in the ring holder by crimping.

In a further embodiment of the invention the sealing ring [2] is held in a recess [3] in the holder [1] by folding over the sides of the recess so that the ring is crimped. This is achieved by using a tool which heats the plastic, forms it into position and cools the plastic so that it is set in the new position, see FIG. 3.

Other preferred features of the method will be understood by analogy with the foregoing.

What is claimed as new and desired to be protected by Letters Patent of the United States is:

1. A sealing ring assembly for fitment to an electrochemical cell used for ECV profiling of a semiconductor sample to define a contact area between electrolyte within the cell and the semiconductor sample comprises a sealing ring having a generally axial central bore, and a sealing ring holder adapted to engage upon an electrochemical cell and so retain the sealing ring in position, wherein the holder is provided with at least one secondary bore providing fluid communication between a forward face of the holder and the central bore, the or each secondary bore being directed parallel to but tangentially offset relative to the inner wall of the central bore so as to impart a degree of rotational flow to electrolyte entering the sealing ring through the or each secondary bore.

2. A sealing ring assembly in accordance with claim 1 wherein a plurality of secondary bores are provided, disposed in suitable array around the sealing ring.

3. A sealing ring assembly in accordance with claim 2 wherein the secondary bores are disposed so that the nozzles are positioned in at least one circular or arcuate array.

4. A sealing ring assembly in accordance with claim 3 wherein the nozzles are positioned in an arcuate array extending across no more than half a circle adapted in use to extend across the lower half of the sealing ring.

5. A sealing ring assembly in accordance with claim 1 wherein the sealing ring holder has cell engagement means to engage with an electrochemical cell, and means to receive the sealing ring so as to position the same in correct location relative to the cell when the cell engagement means are engaged thereon.

6. A sealing ring assembly in accordance with claim 5 wherein the sealing ring is held in the holder by overfolds at the edges of the recess in which the ring sits.

7. A sealing ring assembly in accordance with claim 1 wherein the holder has a portion which can be gripped and is designed such that the holder can be placed in and removed from the electrochemical cell without damaging the seal.

8. A sealing ring assembly in accordance with claim 1 wherein the holder comprises a cavity in its rear face to allow gas bubbles to rise and be removed from the inner bore of the ring.

9. A sealing ring assembly in accordance with claim 1 wherein the ring has a cylindrical, conical or frustoconical shape and is provided with a central axial primary bore.

10. A sealing ring assembly in accordance with claim 9 wherein the ring has a frustoconical body with the inner bore of the ring is tapered towards the sealing edge with the widest part being away from the sealing edge on the back face of the ring.

11. A sealing ring assembly in accordance with claim 1 wherein the ring has a frustoconical body with the inner bore of the ring is tapered towards the sealing edge with the widest part being away from the sealing edge on the back face of the ring.

12. A sealing ring assembly in accordance with claim 1 wherein the ring is structurally adapted to facilitate a degree of self alignment in use.

13. A sealing ring assembly in accordance with claim 12 wherein the sealing ring is a composite sandwich structure comprising a relatively rigid primary sealing ring additionally sandwiched on either side by relatively compliant chemically resistant secondary rings.

14. An electrochemical cell used for ECV profiling of a semiconductor sample comprising a sealing ring assembly in accordance with claim 1 incorporated thereupon.

* * * * *